(12) United States Patent
Tomida

(10) Patent No.: US 10,083,847 B2
(45) Date of Patent: Sep. 25, 2018

(54) CEILING TRANSPORT VEHICLE

(71) Applicant: Daifuku Co., Ltd., Osaka-shi (JP)

(72) Inventor: Daichi Tomida, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 210 days.

(21) Appl. No.: 15/028,037

(22) PCT Filed: Oct. 6, 2014

(86) PCT No.: PCT/JP2014/076679
§ 371 (c)(1),
(2) Date: Apr. 8, 2016

(87) PCT Pub. No.: WO2015/053214
PCT Pub. Date: Apr. 16, 2015

(65) Prior Publication Data
US 2016/0240417 A1    Aug. 18, 2016

(30) Foreign Application Priority Data
Oct. 10, 2013    (JP) .................................. 2013-213059

(51) Int. Cl.
*H01L 21/67*    (2006.01)
*H01L 21/677*    (2006.01)
(Continued)

(52) U.S. Cl.
CPC .......... *H01L 21/67733* (2013.01); *B61B 3/02* (2013.01); *B66C 13/085* (2013.01);
(Continued)

(58) Field of Classification Search
CPC ......... H01L 21/67733; H01L 21/67259; B66C 13/085; B66C 13/18; B66C 15/045
(Continued)

(56) References Cited

U.S. PATENT DOCUMENTS 6,504,144 B1 *    1/2003    Murata ............. H01L 21/67259
                                                            250/224
2004/0118980 A1 *    6/2004    Chang ..................... G01S 17/88
                                                            246/10
(Continued)

FOREIGN PATENT DOCUMENTS

JP        3371897 B2        8/2001
JP        201256664 A        3/2012

*Primary Examiner* — Glenn F Myers
(74) *Attorney, Agent, or Firm* — The Webb Law Firm

(57) ABSTRACT

A ceiling transport vehicle includes an obstacle detecting portion fixed to a main body portion at a location that is above an article supported by a vertically movable member located at a transport purpose position. The obstacle detection portion is within an area in which the article exists in plan view such that a direction in which detection light, etc., is emitted is tilted outward of the article. When vertically moving the vertically movable member between the transport purpose position and the transfer purpose position, the controller is configured not to determine presence of an obstacle based on detected information from the obstacle detecting portion while the vertically movable member is located in a subject range, and is configured to determine presence of an obstacle while it is not located in the subject range.

6 Claims, 8 Drawing Sheets

(51) Int. Cl.
*B61B 3/02* (2006.01)
*B66C 13/08* (2006.01)
*B66C 15/04* (2006.01)
*B66C 13/18* (2006.01)

(52) U.S. Cl.
CPC ............ *B66C 13/18* (2013.01); *B66C 15/045* (2013.01); *H01L 21/67259* (2013.01); *H01L 21/67736* (2013.01)

(58) Field of Classification Search
USPC .......................................... 700/258; 212/276
See application file for complete search history.

(56) References Cited

U.S. PATENT DOCUMENTS

| | | | |
|---|---|---|---|
| 2005/0011851 A1* | 1/2005 | Ikeya | B66C 13/085 212/331 |
| 2005/0079041 A1* | 4/2005 | Campbell | B66C 13/06 414/626 |
| 2008/0128374 A1 | 6/2008 | Kyutoku | |
| 2009/0035104 A1* | 2/2009 | Onishi | B65G 37/02 414/222.13 |
| 2010/0239400 A1* | 9/2010 | Ishikawa | B65G 37/02 414/373 |
| 2011/0262004 A1* | 10/2011 | Murakami | B66C 13/22 382/103 |

\* cited by examiner

CEILING TRANSPORT VEHICLE

CROSS-REFERENCE TO RELATED APPLICATIONS

This application is the United States national phase of International Application No. PCT/JP2014/076679 filed Oct. 6, 2014, and claims priority to Japanese Patent Application No. 2013-213059 filed Oct. 10, 2013, the disclosures of which are hereby incorporated in their entirety by reference.

TECHNICAL FIELD

The present invention relates to a ceiling transport vehicle comprising a travel portion capable of traveling along a travel rail suspended from a ceiling, a main body portion which is suspended from and supported by the said travel portion and which travels integrally with the travel portion, and a vertically movable member which is capable of supporting an article to be transported and which is vertically movable with respect to the main body portion between a transport purpose position located inside the main body portion and a transfer purpose position below the main body portion, wherein the ceiling transport vehicle transports an article along the travel rail by a traveling operation of the travel portion, with the article supported by the vertically movable member located at the transport purpose position, and is capable of transferring an article to and from an article transfer location by a vertical movement operation of the vertically movable member between the transport purpose position and the transfer purpose position.

DESCRIPTION OF RELATED ART

A ceiling transport vehicle such as one described above is configured to perform an unloading operation in which an article supported by the vertically movable member and located at a transport purpose position is lowered to a transfer purpose position, and a pick up operation in which an article to be transported is supported by the vertically movable member and is raised to the transport purpose position in order to transport an article to be transported located at a transfer purpose position.

In such a ceiling transport vehicle, if the vertically movable member is lowered when an obstacle exists below the vertically movable member, there is a possibility that the article supported by the vertically movable member and the obstacle that exists below it may interfere, or come into contact, with each other. To this end, to detect any obstacle below the vertically movable member, a ceiling transport vehicle is known in which an obstacle detecting portion is provided which emits detection light downward to detect an obstacle (see, for example, Patent Document 1).

In the ceiling transport vehicle of Patent Document 1, the obstacle detecting portion is provided to a main body portion at a location outside an area in which the article to be transported exists, in plan view, and is configured to detect along the direction directly below. And when an obstacle that exists below the vertically movable member is detected by the obstacle detecting portion, an anomalous state response operation, such as stopping the vertical movement of the vertically movable member, is performed.

PRIOR ART DOCUMENTS

Patent Document

Patent Document 1: JP Patent No. 3371897

SUMMARY OF THE INVENTION

Problems to be Solved by the Invention

However, the obstacle detecting portion in the ceiling transport vehicle of Patent Document 1 is provided at a location outside the area of the article in plan view; thus, as the article to be transported becomes larger, the location of the obstacle detecting portion would be displaced farther from the center of the vehicle body in plan view for articles of a larger size in plan view.

Thus, there is a concern that the outline of the ceiling transport vehicle in plan view would have to be larger for articles of larger size in order to locate the obstacle detecting portion within the bounds of the ceiling transport vehicle in plan view.

Accordingly, a ceiling transport vehicle is desired in which any obstacle located below the vertically movable member can be detected properly while reducing any increase in the size of the ceiling transport vehicle even when transporting large articles.

Means for Solving the Problems

A ceiling transport vehicle in accordance with the present invention for solving the problems described above comprises a travel portion capable of traveling along a travel rail suspended from a ceiling; a main body portion which is suspended from and supported by the said travel portion and which travels integrally with the travel portion; a vertically movable member which is capable of supporting an article to be transported and which is vertically movable with respect to the main body portion between a transport purpose position located inside the main body portion and a transfer purpose position below the main body portion; wherein the ceiling transport vehicle transports an article along the travel rail by a traveling operation of the travel portion, with the article supported by the vertically movable member located at the transport purpose position, and is capable of transferring an article to and from an article transfer location by a vertical movement operation of the vertically movable member between the transport purpose position and the transfer purpose position.

The invention is characterized by an obstacle detecting portion for detecting an obstacle by emitting detection light or detection sound downwardly to detect the obstacle that becomes an obstruction when transferring an article to or from the article transfer location; a vertical position detector for detecting a vertical position of the vertically movable member; and a controller for controlling vertical movement operation of the vertically movable member based on detected information from the vertical position detector; wherein the obstacle detecting portion is fixed to the main body portion at a location that is above an article supported by the vertically movable member located at the transport purpose position, and that is within an area in which the article exists in plan view such that a direction in which the detection light or the detection sound is emitted is tilted outward of the article, wherein, when vertically moving the vertically movable member between the transport purpose position and the transfer purpose position, the controller is configured not to determine presence of an obstacle based on detected information from the obstacle detecting portion while the vertically movable member is located in a subject range, and is configured to determine presence of an obstacle based on detected information from the obstacle detecting portion while the vertically movable member is not located in the subject range, and wherein, with a detection range being defined as a range in which the detection light or the detection sound of the obstacle detecting portion detects an article supported by the vertically movable member, the subject range is set so as to include the detection range.

That is, in the ceiling transport vehicle, the obstacle detecting portion, for detecting an obstacle which exists under the vertically movable member when lowering the vertically movable member, is fixedly provided to the main body portion.

The obstacle detecting portion is provided at a location that is above an article supported by the vertically movable member located at the transport purpose position, and that is within an area in which the article exists in plan view such that the direction in which the detection light or the detection sound is emitted is tilted outward of the article; thus, even when supporting a large article with the vertically movable member, the article would be outside the detection range of the obstacle detecting portion when the article is located at or below a certain height. Thus, the detection light or the detection sound of the obstacle detecting portion does not detect the article and, when an obstacle exists, detects the obstacle.

Accordingly, when vertically moving the vertically movable member between the transport purpose position and the transfer purpose position, and with the detection range being defined as a range in which the detection light or the detection sound of the obstacle detecting portion detects an article supported by the vertically movable member, any obstacle located below the vertically movable member can be properly detected while avoiding the situation of the obstacle detecting portion detecting the article as an obstacle by making arrangements such that the presence of an obstacle based on the detected information from the obstacle detecting portion is not determined while the vertically movable member is located in the subject range which is set so as to include the detection range and such that the presence of an obstacle based on the detected information from the obstacle detecting portion is determined while the vertically movable member is not located in a subject range.

Further, since the obstacle detecting portion is provided at a location that is further within an area in which the article exists, in plan view, than the article supported by the vertically movable member located at the transport purpose position, any increase in the size of the ceiling transport vehicle in plan view can be reduced.

As such, a ceiling transport vehicle can be provided in which any obstacle located below the vertically movable member can be detected properly while reducing any increase in the size of the ceiling transport vehicle even when transporting large articles.

Examples of preferred embodiments of a ceiling transport vehicle in accordance with the present invention are described next.

In an embodiment of the ceiling transport vehicle in accordance with the present invention, the obstacle is preferably a worker working below the main body portion, wherein worker workspace in which the worker performs work is preferably defined on one side, of the article transfer location, along a lateral direction of the travel portion which perpendicularly intersects the travel rail whereas worker non-workspace in which the worker does not perform work is defined on the other side thereof, and wherein the obstacle detecting portion is preferably offset toward the worker workspace along the lateral direction of the travel portion.

That is, the obstacle detecting portion is located closer to the worker workspace, out of the worker workspace and worker non-workspace, along the lateral direction of the travel portion; thus, a worker working in the vicinity of the article transfer location below the main body portion can be properly detected.

In an embodiment of the ceiling transport vehicle in accordance with the present invention, the lower limit of the subject range is preferably a criterion height set to be higher than an obstacle height defined as a height of the obstacle, and wherein the controller preferably determines that the vertically movable member is located in the subject range if the vertically movable member is located at a greater height than the criterion height.

That is, since the controller determines that the vertically movable member is located in the subject range if the vertically movable member is located at a greater height than the criterion height that is set to be higher than an obstacle height, the presence of any obstacle can be determined based on the detected information from the obstacle detecting portion while the vertically movable member is located at a height at which an obstacle may exist. Therefore, an obstacle can be properly detected.

In an embodiment of the ceiling transport vehicle in accordance with the present invention, the obstacle is preferably a worker working below the main body portion, wherein the obstacle height is preferably a worker's height defined as a height of the worker.

That is, since the obstacle height is the worker's height defined as the height of a worker working in the vicinity of the article transfer location below the main body portion, the presence of an obstacle based on the detected information from the obstacle detecting portion can be determined while the vertically movable member is located at the height at which the worker working, such as by walking on the floor surface, may exist. Therefore, any worker working at an article transfer location can be properly detected.

In an embodiment of the ceiling transport vehicle in accordance with the present invention, the criterion height is preferably set to be a height that is higher than the height of the obstacle by an amount that is greater than or equal to a vertical dimension of an article supported by the vertically movable member.

That is, since the criterion height is set to be a height that is higher than the height of the obstacle by an amount that is greater than or equal to a vertical dimension of an article supported by the vertically movable member, the height of the article is properly taken into consideration; thus, any interference between the article supported by the vertically movable member and an obstacle which exists below it can be reduced.

In an embodiment of the ceiling transport vehicle in accordance with the present invention, articles to be transported preferably include a small article whose outer edge of an area of existence in plan view is inward of a location at which the obstacle detecting portion is attached, wherein an article identification information acquisition portion is preferably provided for obtaining article identification information for identifying whether the article to be transported supported by the vertically movable member is the small article, and wherein the controller is preferably configured to determine presence of an obstacle based on the detected information from the obstacle detecting portion even while the vertically movable member is located in the subject range, if the controller determines that the article to be transported is a small article based on the article identification information obtained by the article identification information acquisition portion.

That is, for an article that is not a small article, i.e., an article whose outer edge of an area of existence in plan view is outward of a location at which the obstacle detecting portion is attached, the detection light or the detection sound which the obstacle detecting portion emits is interrupted by the article while the vertically movable member is located in the detection range, as described above.

Thus, it is necessary to perform a control of not determining the presence of an obstacle based on the detected information from the obstacle detecting portion while the vertically movable member is located in the subject range which is set to contain the detection range, as described above.

On the other hand, for a small article whose outer edge of an area of existence in plan view is inward of a location at which the obstacle detecting portion is attached, the detection light or the detection sound which the obstacle detecting portion emits is not interrupted by the small article even when the vertically movable member is located in the detection range. Therefore, in this case, it is unnecessary to perform a control of not determining the presence of an obstacle based on the detected information from the obstacle detecting portion while the vertically movable member is located in the subject range.

Thus, a ceiling transport vehicle can be provided in which an obstacle be detected more properly by determining the presence of the obstacle based on the detected information from the obstacle detecting portion even while the vertically movable member is located in the subject range if and when it is determined that the article to be transported is a small article, based on the article identification information obtained by the article identification information acquisition portion.

MODES FOR CARRYING OUT THE INVENTION

The ceiling transport vehicle of the present invention as it is applied to a semiconductor substrate processing facility is described with reference to the drawings.

Figure 1:
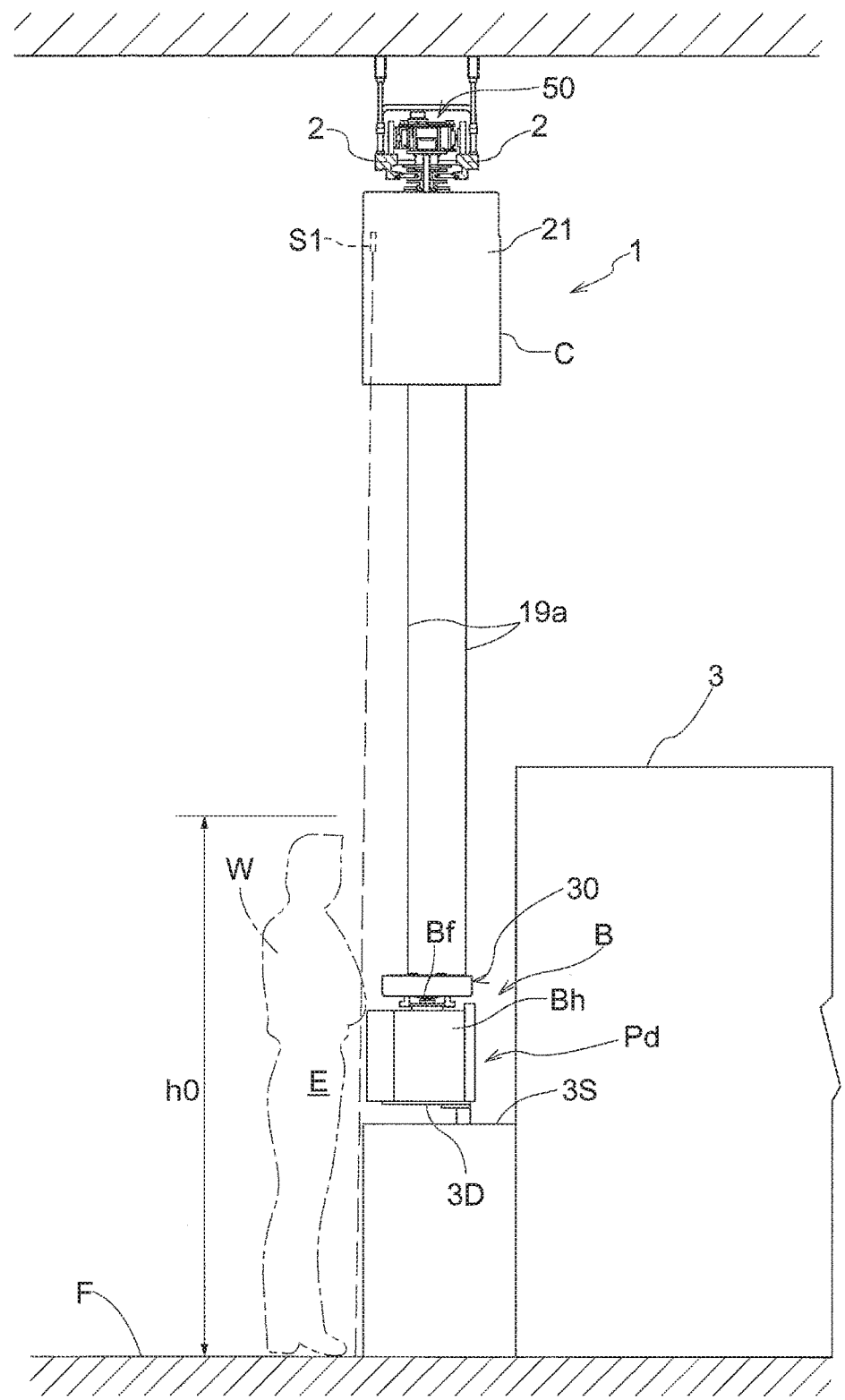
FIG. 1 is an elevational view of a ceiling transport vehicle in accordance with an embodiment, and a semiconductor substrate processing facility having the same.

As shown in FIG. 1, the semiconductor substrate processing facility includes travel rails 2 installed on the ceiling side such that the travel rails 2 extend by way of stations 3S of processing devices 3, and a ceiling, or overhead, transport vehicle 1 capable of traveling along the travel rails 2. The ceiling transport vehicle 1 is configured to transport a container B among a plurality of processing devices 3 with the container B holding semiconductor substrates treated as an article to be transported. For example, the processing devices are configured to perform predetermined operations on work-in-process parts during the manufacture of semiconductor substrates, etc. The travel rails 2 are fixedly installed to the ceiling area by means of travel rail brackets.

Figure 2:
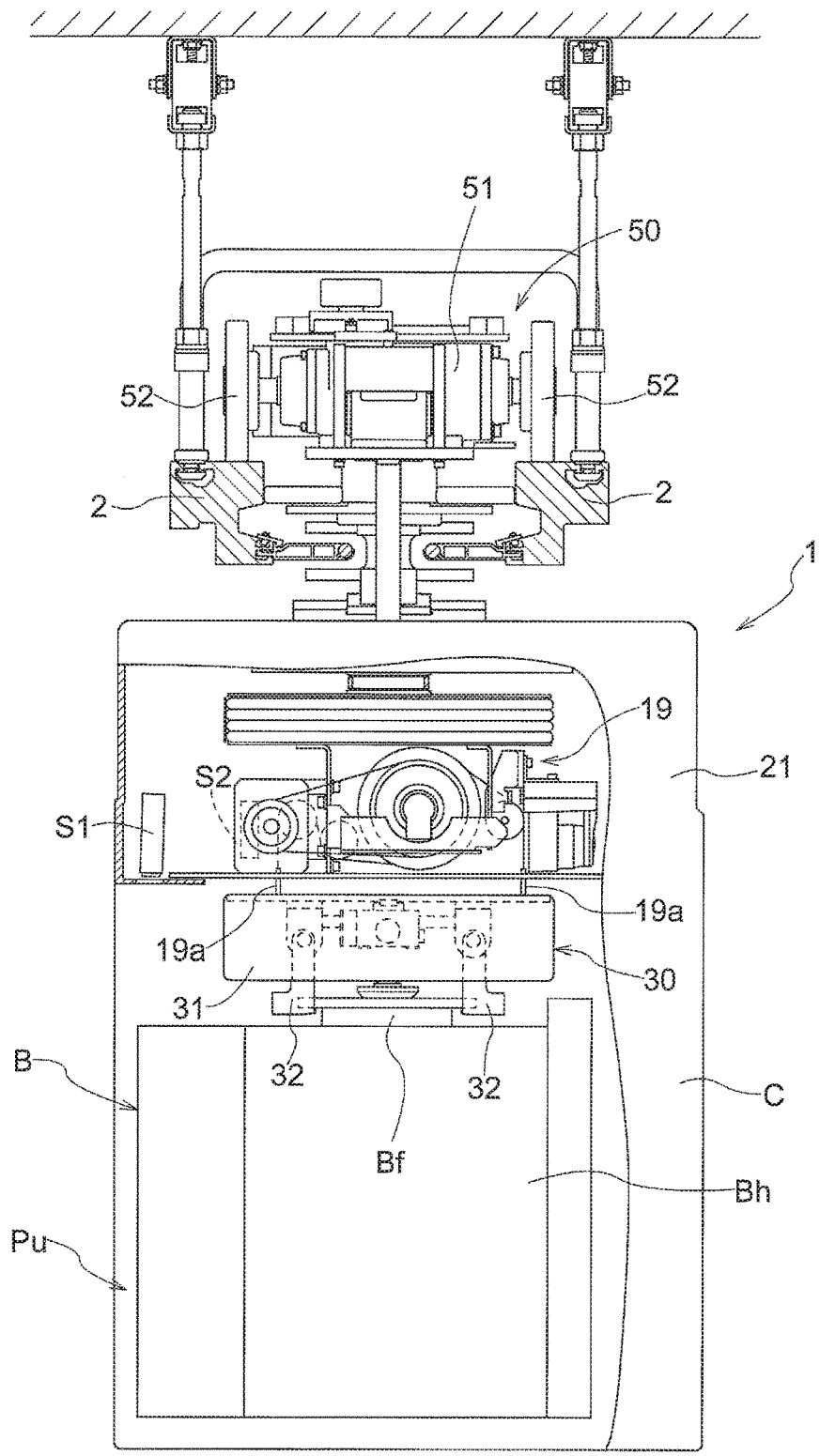
FIG. 2 is a partially cut-out front view of the ceiling transport vehicle.

As shown in FIG. 2, the ceiling transport vehicle 1 includes a pair of travel wheels 52 which roll on the travel rails 2, a travel portion 50 having a travel actuator 51 for actuating the pair of travel wheels 52, a main body portion 21 supported by the travel portion 50 with the main body portion 21 suspended therefrom, a vertically movable member 30 which has a grip portion 32 for gripping or holding a flange portion Bf of a container B with the grip portion 32 suspended therefrom and which is vertically moved by a vertical movement actuator 19, and the vertical movement actuator 19 fixed to an upper portion of the main body portion 21 for vertically moving the vertically movable member 30. The vertical movement actuator 19 includes a wire spooling drum around which the wires 19a whose ends are connected to the vertically movable member 30 are wound, and a drum actuating motor. It is arranged such that the vertically movable member 30 is raised by causing the drum actuating motor to rotate in a forward direction to spool the wires 19a and that the vertically movable member 30 is lowered by causing the drum actuating motor to rotate in a reverse direction to feed out the wires 19a. A rotary encoder S2 which functions as a vertical position detector for detecting the vertical position of the vertically movable member 30 by detecting the number of rotation of the drum actuating motor is provided near the drum actuating motor of the vertical movement actuator 19.

The main body portion 21 is covered by a main body cover C such that the vertically movable member 30 and the container B supported thereby are located within the main body cover C in a side view when the vertically movable member 30 is located at a vertical upper limit position. In addition, the main body cover C are open on both sides along a lateral direction which is perpendicular to the travel direction of the travel portion 50 in plan view.

The vertical movement actuator 19 causes the vertically movable member 30 to vertically move in order to raise and lower the container between a position (transfer purpose position Pd) at which the container B is supported by a support platform 3D of the station 3S which functions as an article transfer location and the aforementioned vertical movement upper limit position (transport purpose position Pu).

In other words, the ceiling transport vehicle 1 includes the travel portion 50 capable of traveling along the travel rails 2 suspended from the ceiling, the main body portion 21 which is suspended from and supported by the travel portion 50 to travel integrally with the travel portion 50, and the vertically movable member 30 which is capable of supporting the container B to be transported, and which is vertically movable with respect to the main body portion 21 between the transport purpose position Pu located within the main body portion 21 and the transfer purpose position Pd located below the main body portion 21. And the ceiling transport vehicle 1 is configured to transport the container B through, or by, the traveling operation of the travel portion 50 along the travel rails 2 while supporting the container B with the vertically movable member 30 located at the transport purpose position Pu, and is configured to be capable of transferring the container B to and from the support platform 3D through, or by, the vertical movement operation of the vertically movable member 30 between the transport purpose position Pu and the transfer purpose position Pd.

The semiconductor substrate processing facility in the present embodiment is configured to be capable of processing 450-mm wafers. However, since changing of the layout of the processing facility for the old 300-mm wafers would lead to a dramatic increase in the updating cost of the facility, the facility layout and the design of the ceiling transport vehicle 1 are in common with those for the processing facility for the 300-mm wafers.

Figure 3:
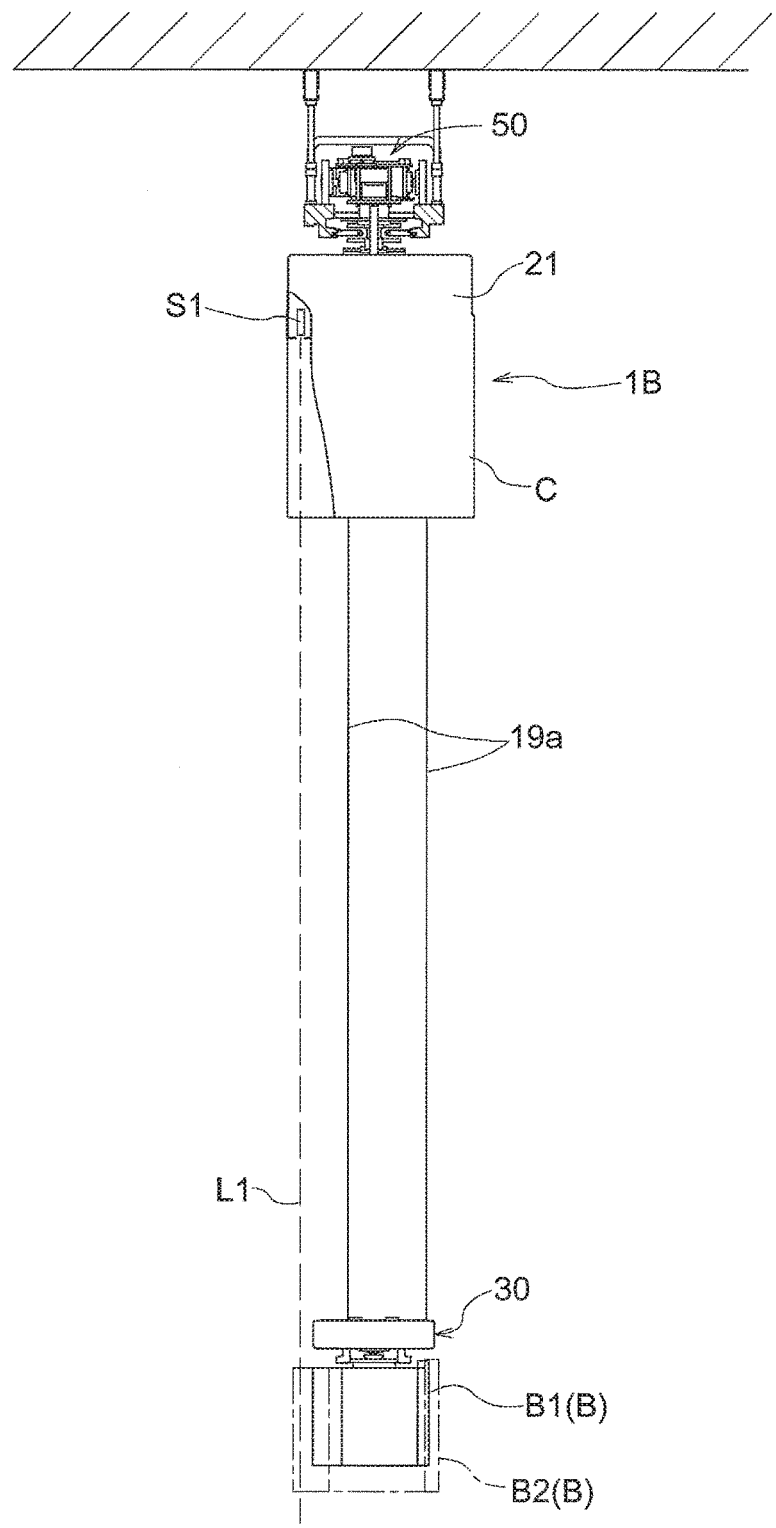
FIG. 3 shows a relationship between a small article and a large article on the one hand and detection light on the other hand in a ceiling transport vehicle having a conventional obstacle detecting portion.

Thus, a ceiling transport vehicle 1B for a processing facility for conventional 300-mm wafers is shown in FIG. 3 as an example for comparison. In FIG. 3, the container for 300-mm wafer (referred to hereinafter as a small container B1) is indicated by the reference numeral B1.

In the ceiling transport vehicle 1B, the obstacle detecting sensor S1 is configured to emit detection light L1 toward directly below itself to detect an obstacle.

In addition, a container for 450-mm wafers (referred to hereinafter as a large container B2) supported by the vertically movable member 30 of the ceiling transport vehicle 1B is shown in FIG. 3 with double dashed lines.

As can be seen from FIG. 3, when attempting to transport a large container B2 with the conventional ceiling transport vehicle 1B, the detection light from the obstacle detecting sensor S1 is interrupted or blocked by the large container B2, making it impossible to detect any obstacle which exists under the large container B2.

Figure 4:
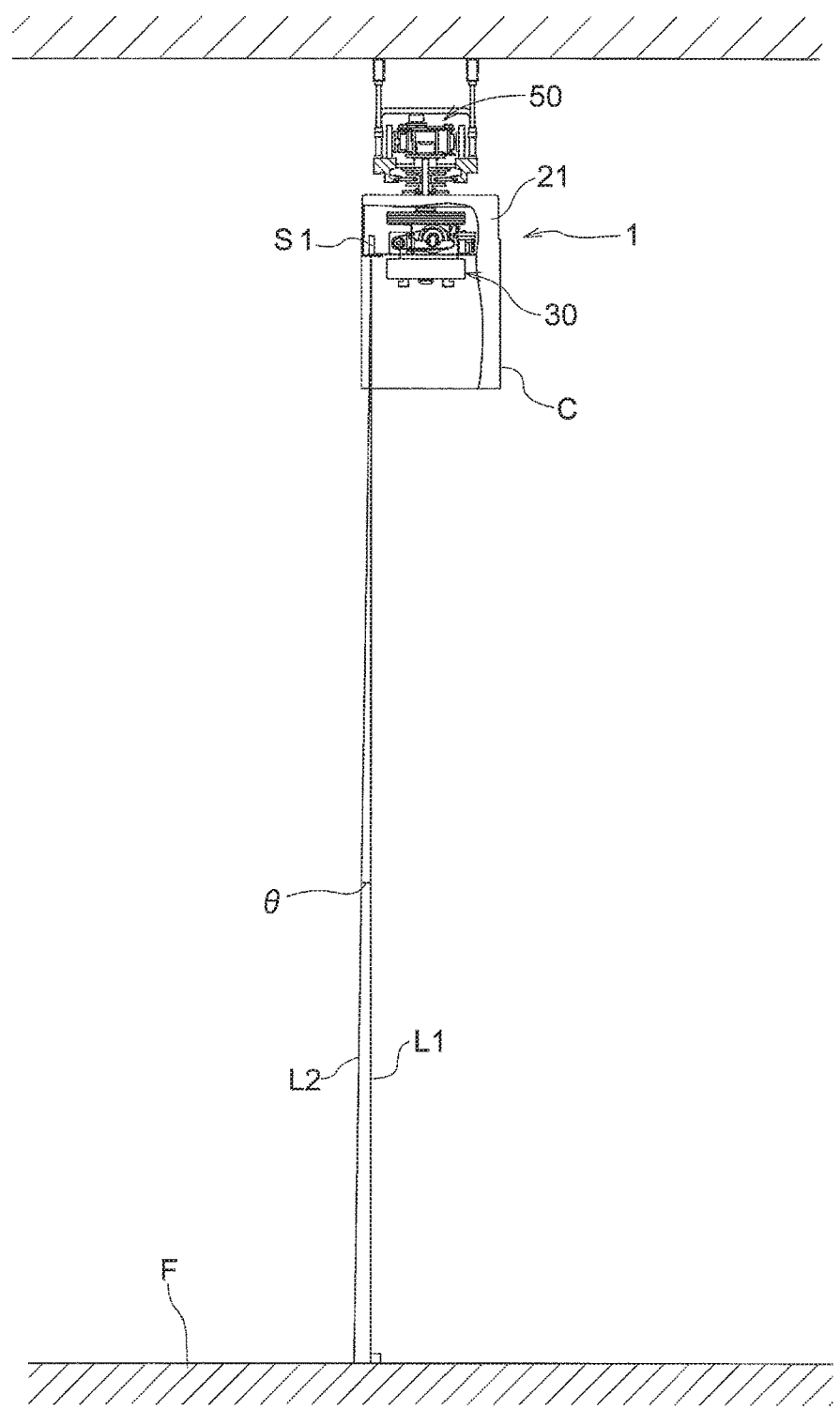
FIG. 4 shows a direction in which the detection light of the obstacle detecting portion is emitted in the ceiling transport vehicle of an embodiment.
Figure 5:
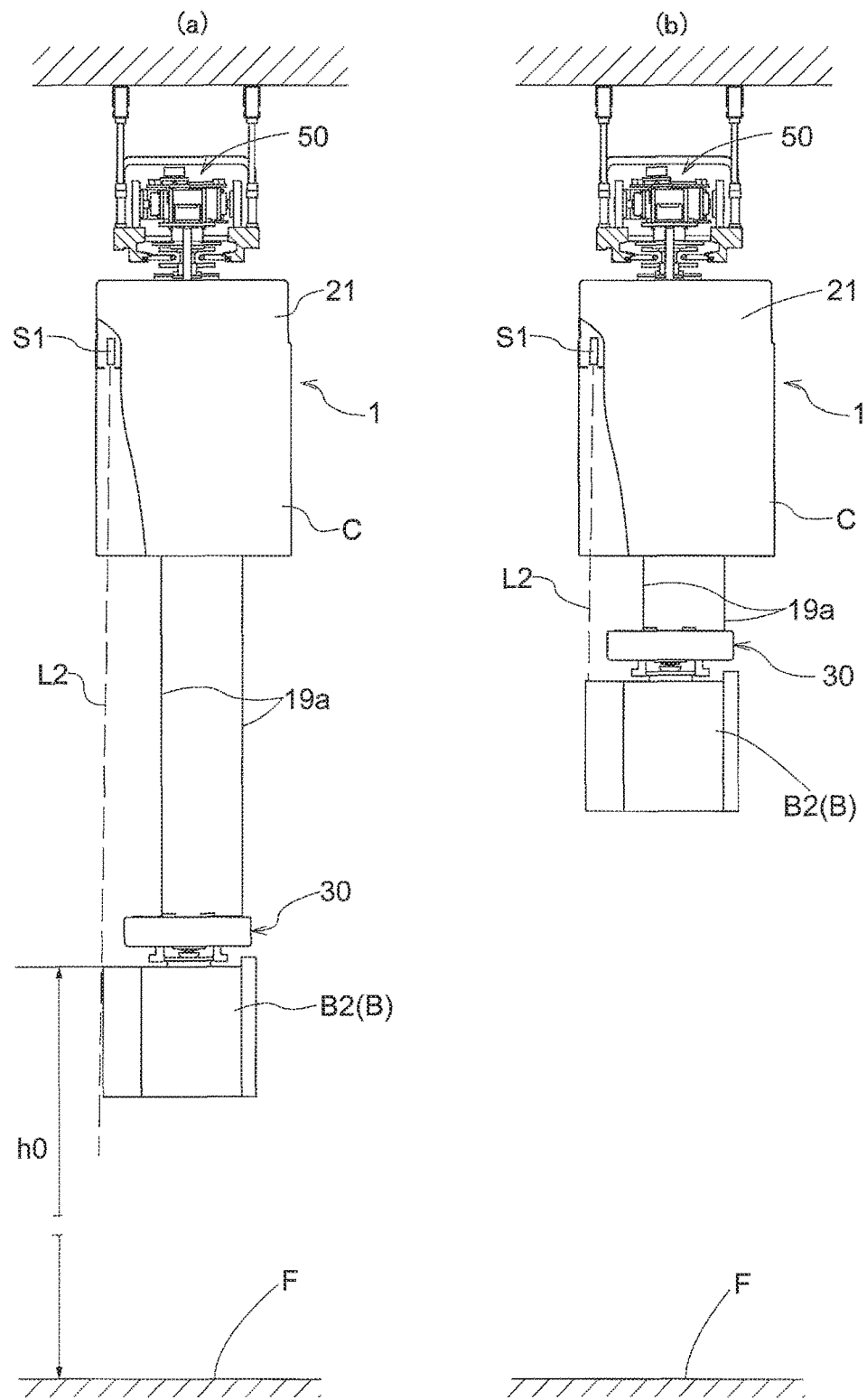
FIG. 5 shows a relationship between the detection light of the obstacle detecting portion and an article as the article is vertically moved.

Thus, in the present embodiment, as shown in FIGS. 1, 4 and 5, an obstacle detecting sensor S1 as an obstacle detecting portion which emits detection light downward to detect an obstacle is provided to be located to one lateral side of the vertical movement actuator 19 and within the main body cover C, to detect any obstacle that would get in the way or, become an obstruction, when transferring the container B to or from the support platform 3D.

As shown in FIG. 2, the obstacle detecting sensor S1 is located above the large container B2 (described as the container B) supported by the vertically movable member 30 located in the transport purpose position Pu and within the area in which container B exists in plan view. The obstacle detecting sensor S1 is located outside of the area in which the vertically movable member 30 exists in plan view. In addition, as shown at L2 in FIG. 4, with a line drawn vertically downward in FIG. 4 designated as L1, the direction in which the detection light is emitted is fixed with respect to the main body portion 21 such that it is tilted outwardly of the container B by an angle θ.

In the present embodiment, a worker W working below the main body portion 21 is detected as an obstacle.

In addition, in the present embodiment, as shown in FIG. 1, worker workspace E where work by the worker W is performed is defined on one side of the station 3S along the lateral direction of the travel portion 50 which perpendicularly intersects the travel rails 2 whereas worker non-workspace where work by the worker W is not performed is defined on the other side of the station 3S. And the obstacle detecting sensor S1 is provided such that it is displaced or offset toward the worker workspace E along the lateral direction of the travel portion 50.

Figure 6:
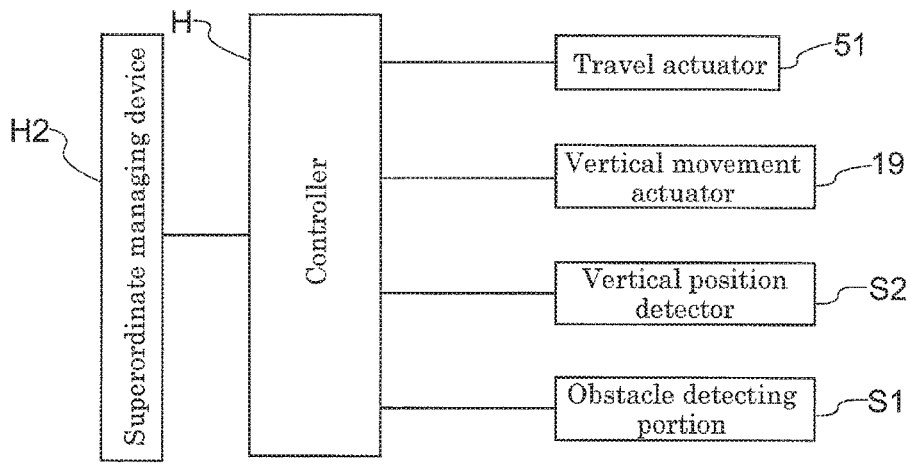
FIG. 6 is a control block diagram.

As shown in FIG. 6, the main body portion 21 has a controller H for controlling the operation of the ceiling transport vehicle 1 of the present embodiment. Connected to the controller H for communication are the travel actuator 51, the vertical movement actuator 19, the obstacle detecting sensor (obstacle detecting portion) S1, the rotary encoder (vertical position detector) S2, and a superordinate managing device H2 for commanding transport of the containers B to the controller H. The controller H is configured such that the detected information from the obstacle detecting sensor S1 and from the rotary encoder S2 is input to it, and is configured to control the operations of the travel actuator S1 and the vertical movement actuator 19.

The controller H is configured to control the vertical movement operation of the vertically movable member 30 by controlling the operation of the vertical movement actuator 19 based on the detected information from the rotary encoder S2.

And, as shown in FIG. 5 (a), this controller H is configured not to determine the presence of an obstacle based on the detected information from the obstacle detecting sensor S1 when it determines, based on the detected information from the rotary encoder S2, that the upper end of the container main body Bh of the container B is located at or above a height h0 from the top surface of the floor F (referred to hereinafter as the floor surface), and is configured to determine the presence of an obstacle based on the detected information from the obstacle detecting sensor S1 when it determines that the upper end of the container main body Bh of the container B is located below the height h0 from the floor surface. Note that the height h0 is set to be higher than the obstacle height defined as the height of the obstacle. The obstacle height is set to, for example, the maximum height of conceivable obstacles, or a standard height of obstacles (average value etc. of the heights of conceivable obstacles), etc. In the present embodiment, the obstacle height is the worker's height defined as the height of a worker since an obstacle is the worker W.

Here, the height h0 is, or corresponds to, the criterion height. And the range between a position at which the vertical position of the vertically movable member 30 is at the transport purpose position Pu and a position at which the upper end of the container main body Bh of the container B is at the height h0 from the floor surface is, or corresponds to, the subject range. As shown in FIG. 5 (a), in the present embodiment, the height h0 is the lower limit for the detection light of the obstacle detecting sensor S1 to detect the container B. That is, when the range in which the detection light of the obstacle detecting sensor S1 detects the container B supported by the vertically movable member 30 is defined to be a detection range, the height h0 is set to be the lower limit of the detection range. Therefore, the subject range set to include the detection range is set to be the same range as the detection range in the present embodiment. Note that the height h0 is defined with the position of the upper end of the container main body Bh of the container B supported by the vertically movable member 30 being designated to be the vertical position of the vertically movable member 30; however, the height h0 may be defined with, among other positions, the position of the grip portion 32 or the position of the main body portion 31 (portion that supports the grip portion 32) of the vertically movable member 30 being designated to be the vertical position of the vertically movable member 30.

That is, when causing the vertically movable member 30 to be vertically moved between the transport purpose position Pu and the transfer purpose position Pd, the controller H is configured not to determine the presence of an obstacle based on the detected information from the obstacle detecting sensor S1 while the vertically movable member 30 is located within the subject range, and to determine the presence of an obstacle based on the detected information from the obstacle detecting sensor S1 while the vertically movable member 30 is not located within the subject range.

While the vertical position of the vertically movable member 30 is within the detection range, as shown in FIG. 5 (b), the obstacle detecting sensor S1 will detect the top surface of the container B. The controller H is configured to determine the presence of an obstacle based on the detected information from the obstacle detecting sensor S1 only while the vertically movable member 30 is not located within the detection range, that is, only while the obstacle detecting sensor does not detect the top surface of the container B as shown in FIG. 5 (a), by setting the subject range so as to include the detection range in which the detection light of the obstacle detecting sensor S1 detects the container B supported by the vertically movable member 30.

Further, the controller H is configured to determine that the vertically movable member 30 is located in the subject range when the vertically movable member 30 is located at a height that is higher than the criterion height which is set to be higher than the worker's height defined as the height of a worker W.

That is, the tilt angle θ, of the direction in which the detection light is emitted by the obstacle detecting sensor S1, from the vertical line is set to be an angle at which the worker W working in the worker workspace E can be detected when lowering the vertically movable member 30.

Figure 9:
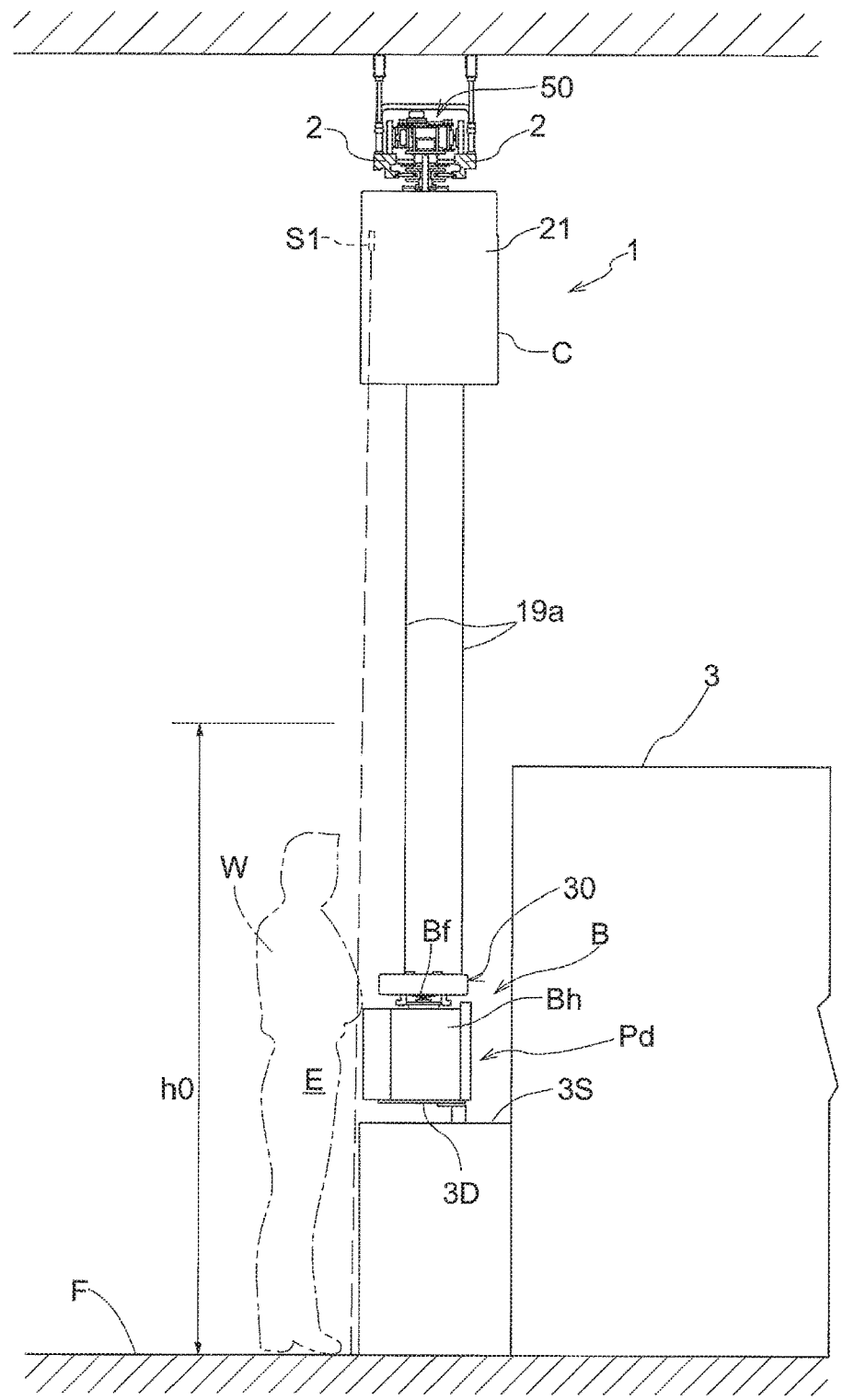
FIG. 9 shows another example of how a criterion height is set.

In addition, the aforementioned tilt angle θ is set to be an angle at which the container B supported by the vertically movable member 30 would not come into the detecting range of the detection light when the vertically movable member 30 is located at positions that are lower than the criterion height. In the present embodiment, aforementioned criterion height is set to be a height that is higher than the worker's height defined as the height of a worker. This makes it possible to properly detect the worker W working in the worker workspace E below the vertically movable member 30. As shown in FIG. 9 which shows an example in which a criterion height (height h0) that is different from that shown in FIG. 1, the criterion height may be set to be a height that is higher than the height of the obstacle (worker's height in the present example) by an amount that is greater than or equal to the vertical dimension of the article (container B) supported by the vertically movable member 30.

Figure 7:
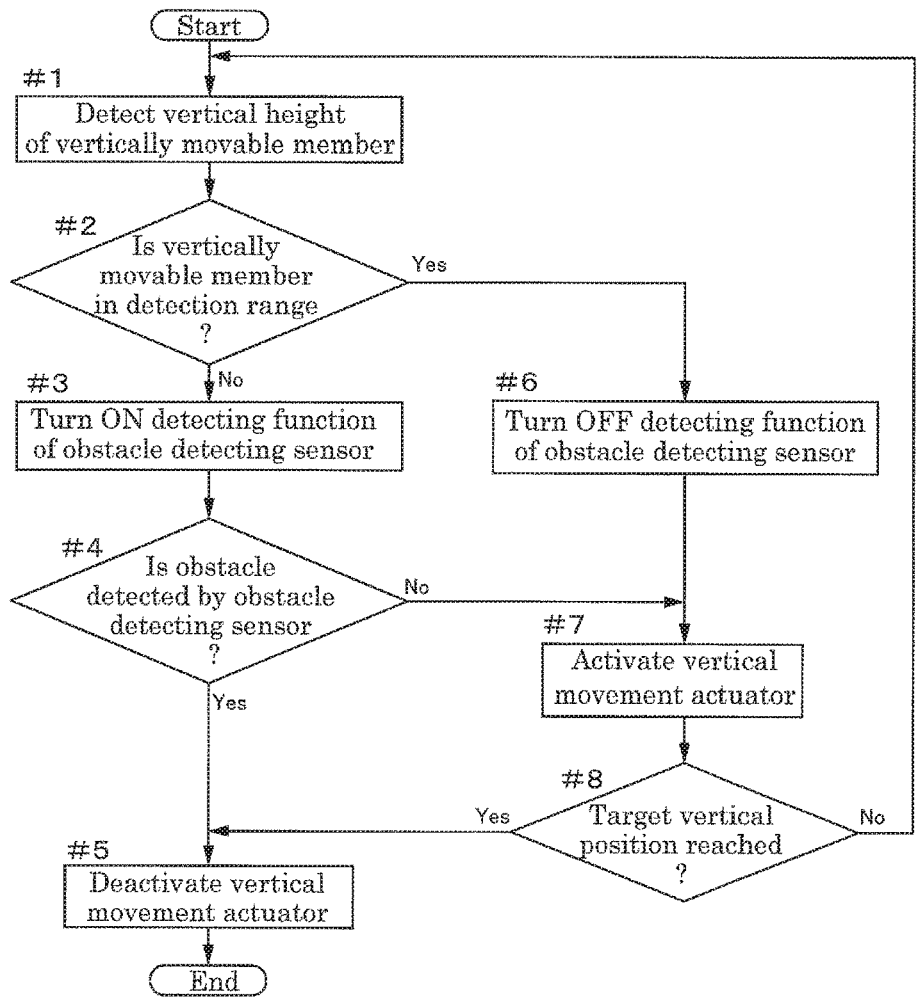
FIG. 7 is a flow chart showing a control performed by a controller.

The control performed by the controller H is described next with reference to the flow chart of FIG. 7.

The controller H firstly detects the vertical position of the vertically movable member 30 (step #1), and subsequently determines whether the vertically movable member 30 belongs to the subject range (the range that is identical to the detection range in the present example) (step #2). If it determines that the vertically movable member 30 does not belong to the subject range (detection range) in step #2 (Step #2: No), then it turns ON the detecting function of the obstacle detecting sensor S1 (step #3). If the obstacle detecting sensor S1 does not detect any obstacle (Step #4: No), it activates the vertical movement actuator 19 (step #7). And if the obstacle detecting sensor S1 detects an obstacle (Step #4: Yes), it deactivates the vertical movement actuator 19 (step #5).

On the other hand, if it determines that the vertically movable member 30 belongs to the subject range (detection range) in step #2 (Step #2: Yes), it turns OFF the detecting function of the obstacle detecting sensor S1 (step #6) and activates the vertical movement actuator 19 (step #7).

When the process in step #7 is performed, it proceeds to determine, based on the detected information from the rotary encoder S2, whether the vertically movable member 30 has reached a target vertical position (step #8). And when it determines that the target vertical position has been reached (Step #8: Yes), it deactivates the vertical movement actuator 19 (step #5). In addition, when it determines that the target vertical position has not been reached in step #8 (Step #8; No), it returns to the process in step #1.

Thus, a ceiling transport vehicle can be provided in which any worker W located below the vertically movable member 30 can be properly detected while reducing any increase in the size of the ceiling transport vehicle even when transporting large articles (large containers B2).

Alternative Embodiments (1) In the embodiment described above, an example is described in which the ceiling transport vehicle 1 is configured to transport, as an article to be transported, a container B for holding semiconductor substrates; however, it is not limited to this arrangement. A reticle container for holding one or more reticles for transferring patterns to semiconductor substrates may be transported in lieu of the container B for holding semiconductor substrates. In addition, arrangements may be made so that both the containers B for holding semiconductor substrates and reticle containers are transported.

(2) In the embodiment described above, an example is described in which the container B to be transported by the ceiling transport vehicle 1 is a large container B2 whose outer edge of an area of its existence in plan view is located outward of the location at which the obstacle detecting portion is attached; however, the container B to be transported by the ceiling transport vehicle 1 may be a small container B2 whose outer edge of area of its existence in plan view is inward of the location at which the obstacle detecting portion is attached.

In this case, to obtain article identification information (for example, transport command information from the superordinate managing device H2, or information stored in RFID attached to the container B, etc.) for identifying whether the container B to be transported and supported by the vertically movable member 30 is a small container B1 which is a small article, an article identification information acquisition portion (which is a communication module of the controller H, etc., when the article identification information is the transport command information from the superordinate managing device H2, or is a wireless input device, etc., when the article identification information is an RFID) is provided. And the controller H may be configured to determine the presence of an obstacle based on the detected information from the obstacle detecting sensor S1 even while the vertically movable member 30 is located within the subject range, when the controller H determines that the container B to be transported is a small container B1 based on the article identification information obtained by the article identification information acquisition portion.

(3) In the embodiment described above, an example is described in which the obstacle detecting sensor S1 emits detection light to detect the obstacle; however, the obstacle detecting sensor S1 may be one that emits detection sound, such as ultrasound to detect an obstacle. In addition, any sensor that emits directional detection medium to detect the presence of an object to be detected may be utilized.

(4) In the embodiment described above, an example is described in which the vertical position of the vertically movable member 30 is detected by means of the rotary encoder S2; however, it is not limited to this arrangement. For example, non-contact distance sensors, such as a laser range finder or ultrasonic range finder may be utilized. And the vertical position of the vertically movable member 30 may be detected using other methods such as reading markings added to the wire 19a for suspending the vertically movable member 30. In addition, the obstacle detecting sensor S1 may be one that can determine the shape and the attribute of an object to be detected, such as a camera, etc. The controller H may be configured to determine or recognize an obstacle and the vertically movable member 30 based on the image information captured by the camera and to measure the vertical position when it is the vertically movable member 30.

Figure 8:
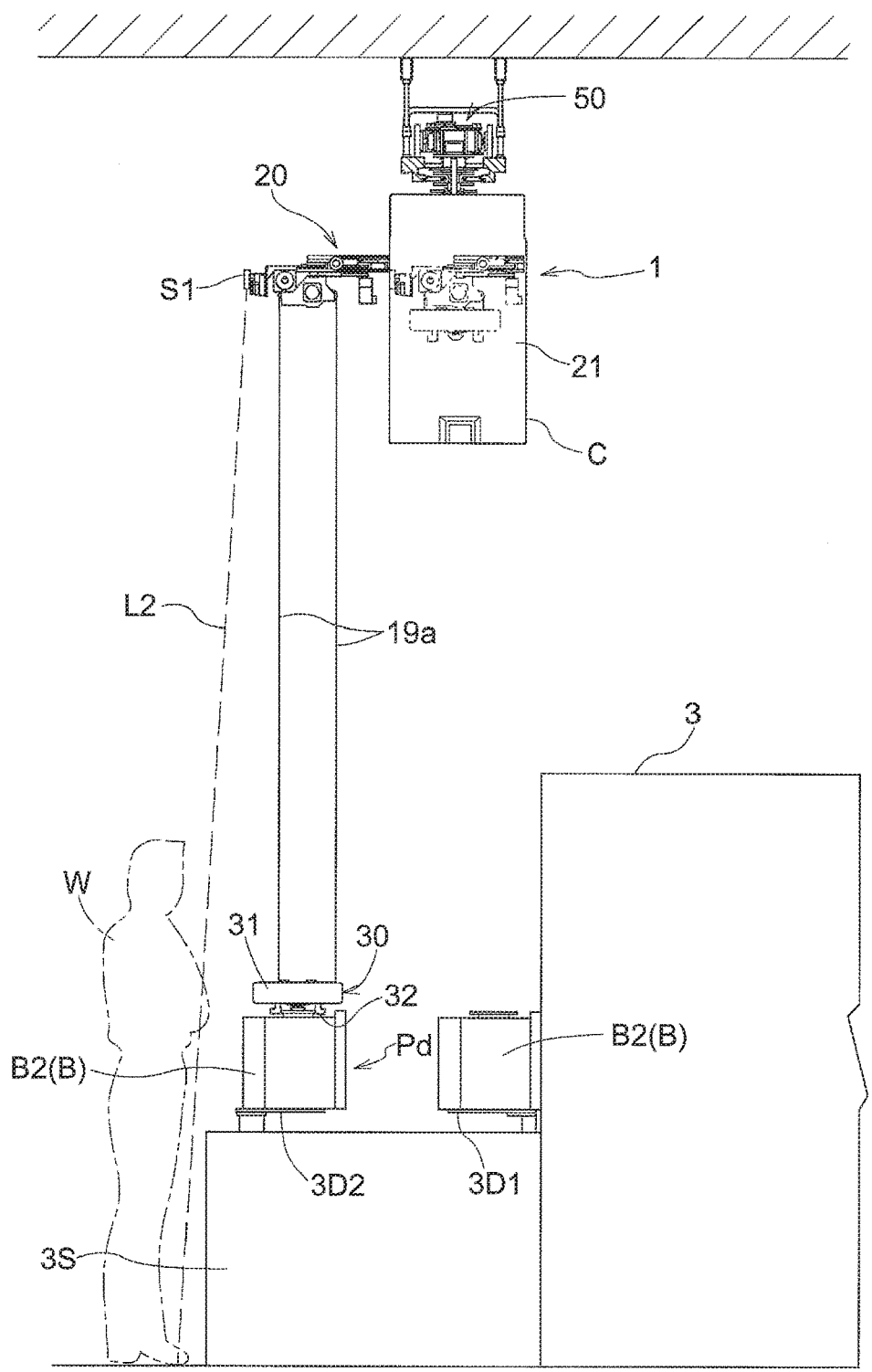
FIG. 8 is an elevational view of a ceiling transport vehicle in accordance with an alternative embodiment, and a semiconductor substrate processing facility having the same.

(5) In the embodiment described above, as shown in FIG. 1, an example is described in which the container B supported by the vertically movable member 30 is vertically moved between the transfer purpose position Pd directly below the main body cover C and the transport purpose position Pu (see FIG. 2) within the main body cover C; however, it is not limited to this arrangement. For example, as shown in FIG. 8, the semiconductor substrate processing facility may include first and second support platforms 3D1, 3D2. A slide portion 20 may be provided which can be switched or moved between a retracted position that overlaps with the main body cover C and a projected position projected to the side the processing device 3 does not exist (or the side of the worker workspace) as seen along the travel direction of the travel portion 50, and which supports the vertical movement actuator 19 of the vertically movable member 30. And arrangements may be made so that the vertically movable member 30 is vertically moved when the slide portion 20 is in a projected position. In this case, the obstacle detecting sensor S1 is located at an end portion of the slide portion 20 on the side of the worker workspace, and at such a location that the obstacle detecting sensor S1 overlaps with the main body cover C when the slide portion 20 is located in the retracted position as seen along the travel direction of the travel portion 50. Thus, an arrangement for fixing the obstacle detecting sensor S1 to the main body portion 21 includes an arrangement in which it is fixed to the slide portion 20 that is slidably attached to the main body portion 21.

(6) In the embodiment described above, an example is described in which the vertical movement actuator 19 is deactivated when the obstacle detecting sensor S1 detects an obstacle; however, it is not limited to such arrangement. And arrangements may be made such that the operation of the vertical movement actuator 19 is controlled to slow down the vertical movement speed of the vertically movable member 30 when the obstacle detecting sensor S1 detects an obstacle.

(7) In the embodiment described above, an example is described such the height h0 is set to be the lower limit of the detection range, that is, the subject range is the same as the detection range; however, it is not limited to such arrangement. And the height h0 may be set to be a lower height than the lower limit of the detection range, that is, the subject range may include a range lower than the detection range.

DESCRIPTION OF REFERENCE NUMERALS AND SYMBOLS

1 Ceiling Transport Vehicle
2 Travel Rail
21 Main Body Portion
30 Vertically Movable Member
50 Travel Portion
B Article
B1 Small Article
E Worker Workspace
H Controller
L1 Detection Light
Pd Transfer Purpose Position
Pu Transport Purpose Position
S1 Obstacle Detecting Portion
W Obstacle

The invention claimed is:

1. A ceiling transport vehicle comprising:
a travel portion capable of traveling along a travel rail suspended from a ceiling;
a main body portion which is suspended from and supported by the said travel portion and which travels integrally with the travel portion;
a vertically movable member which is capable of supporting an article to be transported and which is vertically movable with respect to the main body portion between a transport purpose position located inside the main body portion and a transfer purpose position below the main body portion;
wherein the ceiling transport vehicle transports the article along the travel rail by a traveling operation of the travel portion, with the article supported by the vertically movable member located at the transport purpose position, and is capable of transferring the article to and from an article transfer location by a vertical movement operation of the vertically movable member between the transport purpose position and the transfer purpose position; and
further comprising:
an obstacle detecting portion for detecting an obstacle by emitting detection light or detection sound downwardly to detect the obstacle that becomes an obstruction when transferring the article to or from the article transfer location;
a vertical position detector for detecting a vertical position of the vertically movable member; and
a controller for controlling vertical movement operation of the vertically movable member based on detected information from the vertical position detector;
wherein the obstacle detecting portion is fixed to the main body portion at a location that is above the article supported by the vertically movable member located at the transport purpose position, and that is within an area in which the article exists in plan view such that a direction in which the detection light or the detection sound is emitted is tilted outward of the article,
wherein, when vertically moving the vertically movable member between the transport purpose position and the transfer purpose position, the controller is configured not to determine presence of an obstacle based on detected information from the obstacle detecting portion while the vertically movable member is located in a subject range, and is configured to determine presence of an obstacle based on detected information from the obstacle detecting portion while the vertically movable member is not located in the subject range, and wherein, with a detection range being defined as a range in which the detection light or the detection sound of the obstacle detecting portion detects the article supported by the vertically movable member, the subject range is set so as to include the detection range.

2. The ceiling transport vehicle as defined in claim 1, wherein the obstacle is a worker working below the main body portion, wherein worker workspace in which the worker performs work is defined on one side, of the article transfer location, along a lateral direction of the travel portion which perpendicularly intersects the travel rail whereas worker non-workspace in which the worker does not perform work is defined on the other side thereof, and wherein the obstacle detecting portion is offset toward the worker workspace along the lateral direction of the travel portion.

3. The ceiling transport vehicle as defined in claim 1, wherein a lower limit of the subject range is a criterion height set to be higher than an obstacle height defined as a height of the obstacle, and wherein the controller determines that the vertically movable member is located in the subject range if the vertically movable member is located at a greater height than the criterion height.

4. The ceiling transport vehicle as defined in claim 3, wherein the obstacle is a worker working below the main body portion, and wherein the obstacle height is a worker's height defined as a height of the worker.

5. The ceiling transport vehicle as defined in claim 3, wherein the criterion height is set to be a height that is higher than the height of the obstacle by an amount that is greater than or equal to a vertical dimension of the article supported by the vertically movable member.

6. The ceiling transport vehicle as defined in claim 1, wherein articles to be transported include a small article whose outer edge of an area of existence in plan view is inward of a location at which the obstacle detecting portion is attached, wherein an article identification information acquisition portion is provided for obtaining article identification information for identifying whether the article to be transported that is supported by the vertically movable member is the small article, and wherein the controller is configured to determine presence of an obstacle based on the detected information from the obstacle detecting portion even while the vertically movable member is located in the subject range, if the controller determines that the article to be transported is a small article based on the article identification information obtained by the article identification information acquisition portion.

* * * * *